(12) United States Patent
Ramanan et al.

(10) Patent No.: US 7,767,025 B2
(45) Date of Patent: Aug. 3, 2010

(54) NOZZLE ARRAY CONFIGURATION TO FACILITATE DEFLUX PROCESS IMPROVEMENT IN CHIP ATTACH PROCESS

(75) Inventors: Harikrishnan Ramanan, Chandler, AZ (US); Yongqian J. Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 11/865,057

(22) Filed: Sep. 30, 2007

(65) Prior Publication Data

US 2009/0084412 A1   Apr. 2, 2009

(51) Int. Cl.
   B08B 7/04 (2006.01)
   B08B 1/02 (2006.01)
   B08B 3/02 (2006.01)
(52) U.S. Cl. .............. 134/18; 134/15; 134/36
(58) Field of Classification Search ............. 134/18, 134/36; 222/1, 52; 118/668
See application file for complete search history.

(56) References Cited

U.S. PATENT DOCUMENTS

| | | | | |
|---|---|---|---|---|
| 4,695,482 A | * | 9/1987 | Weiswurm | 427/96.6 |
| 5,271,953 A | * | 12/1993 | Litteral | 427/8 |
| 5,695,571 A | * | 12/1997 | Watanabe et al. | 134/3 |
| 6,287,178 B1 | * | 9/2001 | Huynh et al. | 451/73 |
| 6,390,106 B1 | * | 5/2002 | Lin | 134/172 |
| 2004/0016752 A1 | * | 1/2004 | Ratificar et al. | 219/679 |
| 2004/0248425 A1 | * | 12/2004 | Bem et al. | 438/758 |
| 2006/0174920 A1 | * | 8/2006 | Randhawa | 134/34 |
| 2008/0149692 A1 | | 6/2008 | Ramanan et al. | 228/261 |
| 2008/0156851 A1 | | 7/2008 | Ramanan et al. | 228/223 |
| 2008/0237364 A1 | | 10/2008 | Deshpande et al. | 239/1 |
| 2008/0238589 A1 | | 10/2008 | Quan et al. | 335/85 |
| 2009/0065535 A1 | | 3/2009 | Li et al. | 222/544 |

\* cited by examiner

*Primary Examiner*—Michael Kornakov
*Assistant Examiner*—Natasha Campbell
(74) *Attorney, Agent, or Firm*—Konrad Raynes & Victor LLP; Alan S. Raynes

(57) ABSTRACT

Systems and methods for treating workpieces are described. One embodiment relates to a deflux system including at least one array of nozzles, the nozzles adapted to transmit a fluid outward therefrom. The nozzles are moveable relative to one another, so that a distance between adjacent nozzles can be varied. The nozzles are individually adjustable with respect to an angle of spray emitted therefrom during operation. The system also includes a controller adapted to send a signal to each of the nozzles to transmit the fluid therethrough at a desired angle at a desired time. Other embodiments are described and claimed.

15 Claims, 4 Drawing Sheets

NOZZLE ARRAY CONFIGURATION TO FACILITATE DEFLUX PROCESS IMPROVEMENT IN CHIP ATTACH PROCESS

RELATED ART

Integrated circuits may be formed on semiconductor wafers made of materials such as silicon. The semiconductor wafers are processed to form various electronic devices thereon. The wafers are diced into semiconductor chips, which may then be attached to a package substrate using a variety of known methods.

In certain chip attach processes, solder bumps are placed on pads on the chip, on the substrate, or on both the chip and substrate. The solder bumps are then melted and permitted to flow, to ensure that each bump fully wets the pad it was formed on. A flux is then typically applied to at least one of the surfaces to be joined and the surfaces on the chip and substrate are brought into contact. The flux acts to isolate the solder from the atmosphere and provides an adhesive force which acts to hold the chip and substrate together. A second reflow operation is then carried out by heating the chip and substrate to a temperature greater than the melting point of the solder, and a solder connection is made between the die pads and the substrate pads through bump reflow and chip joining. The joined package is then cooled and the solder joint established. Excess flux or flux residue remaining is then removed in a defluxing operation, which may include chemical rinsing and heating operations.

Defluxing operations such as chemical rinsing have been be carried out using a system including a number of nozzles that deliver a fluid towards one or more substrates positioned on a carrier. Carriers may be positioned on a track that moves the carriers under the nozzles. One such deflux system includes four nozzles having fixed angles of distribution of the fluid. The nozzles are fixed in position on a frame as the carriers are moved thereunder.

BRIEF DESCRIPTION OF THE DRAWINGS

Embodiments are described by way of example, with reference to the accompanying drawings, which are not drawn to scale, wherein.

DETAILED DESCRIPTION

The use of flux in a chip attach process can lead to certain problems. Flux residue can cause voids to form in the solder joints, and thus lower the electrical performance. The flux reside also leads to decreased package reliability. Conventional defluxing systems often do not provide adequate removal of the organic flux residue present in the chip gap.

Certain embodiments relate to a deflux system including a plurality of nozzles that are individually controllable as to the direction and angle of flow of a fluid delivered therefrom. Embodiments may include methods and devices.

Figure 1:
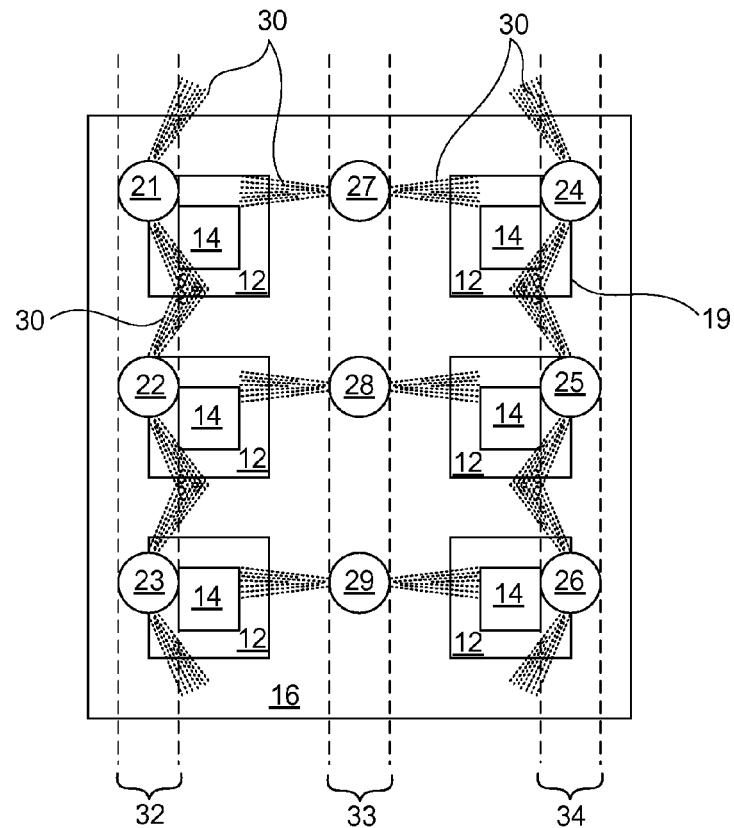
FIG. 1 illustrates a top view of a certain aspects of a system for defluxing chip and substrate package assemblies positioned on a carrier, the system including a plurality of individually controllable nozzles transmitting a fluid onto the chip and substrate package assemblies, in accordance with certain embodiments.
Figure 2:
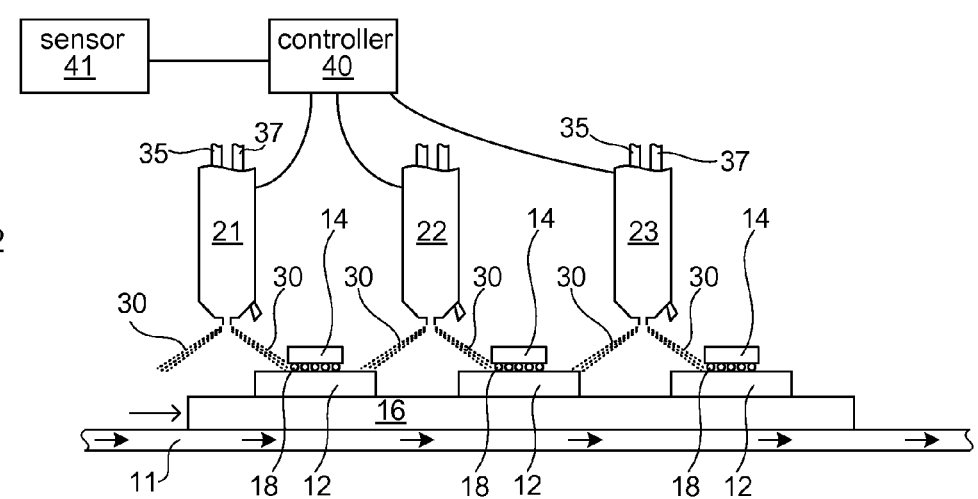
FIG. 2 illustrates a side view of certain aspects of a system for defluxing chip and substrate package assemblies positioned on a carrier, showing the carrier on a moving track, in accordance with certain embodiments.

FIGS. 1-2 illustrate various aspects of a system that may be used to deflux substrates in accordance with certain embodiments. The system includes nine nozzles 21-29 positioned above a moveable track 11 (or carrier rail system) on which one or more carriers such as carrier 16 are placed. The carrier 16 of FIG. 1 includes six package assemblies 19 (workpieces), each including a substrate 12 having a chip 14 thereon.

The nine nozzles 21-29 may be generally positioned in a 3×3 array, as seen in FIG. 1. Each of the nozzles may be moved in relation to the other nozzles. The nozzles may be any suitable nozzle that can deliver a fluid therethrough, including, but not limited to, nozzles including solenoid controlled valves that can be controlled using computer software. The system may also includes suitable hardware and software that enables the nozzles to be physically moved to various positions in the x, y, and z directions. The system may also include a number of arrays of nozzles, positioned sequentially, to form a deflux tool including, for example, up to about 20 arrays of nozzles, with each array including nine nozzles as in FIG. 1.

The nozzles may deliver more than one type of fluid 30 radially outward therefrom. The spray direction, pressure, and angle of spray may be individually controlled for each nozzle and may be changed when desired, so that different nozzles may have different spray directions, pressures, and angles. As seen in FIG. 1, the spray direction from the nozzles 27, 28, 29 in the middle row 33 is different from that of nozzles 21, 22, 23 from the row 32, and different from the spray direction of the nozzles 24, 25, 26 from the row 34.

The fluid 30 that may be used for a process such as a deflux process may include one or more fluid components therein. Examples of fluid components include, but are not limited to, aqueous liquids such as deionized water, solvents such as hydrofluorocarbons (HFC's) and/or hydrochlorofluorocarbons (HCFC's), and gases such as air. In certain embodiments, liquids are used for removing the residue in the chip gap area and gases are used to wash off the residue in the liquid and dry the package during the deflux operation. Other embodiments may alternate the flow of liquid and gas to obtain favorable defluxing results. As noted above, embodiments may include multiple fluid inputs into each nozzle, which permits more than one fluid to be sprayed during a treatment process. Thus, embodiments may include, but are not limited to, deflux operations utilizing (i) deionized water alone, (ii) non-aqueous solvents alone, (iii) deionized water and air (for example, a pulsating sequence of deionized water and air), (iv) a non-aqueous solvent and air, and (v) deionized water and a non-aqueous solvent. The use of a controlled radial spray motion in combination with of different spray options, in accordance with certain embodiments, enables the user to achieve a larger window of deflux process optimization than conventional defluxing operations, with a goal of better flux residue removal and improved package reliability.

FIG. 2 illustrates a side view of a portion of the deflux system of FIG. 1, including nozzles 21, 22, and 23 positioned over the track 11 on which the carrier 26 holding the package assemblies 19 of chips 14 on substrates 12 are positioned. The nozzles may be configured to accept multiple feed lines 35, 37, to permit more than one fluid to be delivered at a time during a process such as defluxing, if desired. The nozzles may in certain embodiments be in communication with a controller 40. The controller 40 may include a microprocessor that can be programmed to control the use and position of each nozzle and the fluid flow therethrough, including, but not limited to, its position, its flow direction, its flow pressure, and its flow angle. Certain embodiments may also include in the system one or more sensors 41, connected to the controller 40. The sensor 41 may be a suitable sensor for determining information such as the size of the carrier 16 and/or the size and configuration of the package assemblies 19 including the chips 14 on the substrates 12. The sensor 41 may send a signal to the controller 40, which may include in memory the desired nozzle configuration, spray angles, spray pressures, and spray directions for different carrier sizes and assembly configurations. The use of the controller 40 and sensor 41 permit an automated process to be carried out.

FIG. 2 also shows a side view of the carrier 16 and three package assemblies of substrates 12 with chips 14 positioned thereon. The carrier 16 sits on the track 11 and may move in the direction of the arrows in the carrier 16. Solder bumps 18 are positioned between the substrates 12 and chips 18. As the package assemblies including the substrates 12 with chips 14 positioned thereon are moved along the system in the direction of the arrows, they will be impacted by flow 30 from nozzles 21, 22, and then 23.

Figure 3:
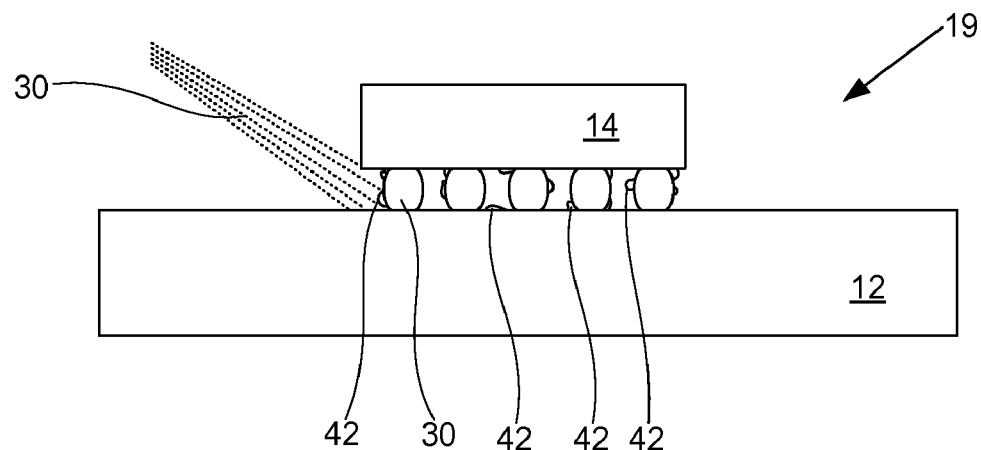
FIG. 3 illustrates a side view of a package assembly including a chip coupled to a substrate through a plurality of solder bumps, and a flow of fluid that contacts the region between the chip and substrate to remove flux residue from the package assembly, in accordance with certain embodiments.

FIG. 3 illustrates a side view of one package assembly 19 including a chip 14 on substrate 12, with solder bumps 18 coupling the chip 14 to the substrate 12. Flux or flux residue particles 42 from processing operations will be dispersed in various locations on the solder bumps or elsewhere between the substrate 12 and chip 18. The flow of fluid 30 impacts against the solder bumps 18 and other surfaces in and near the region between the substrate 12 and chip 18.

Figure 4:
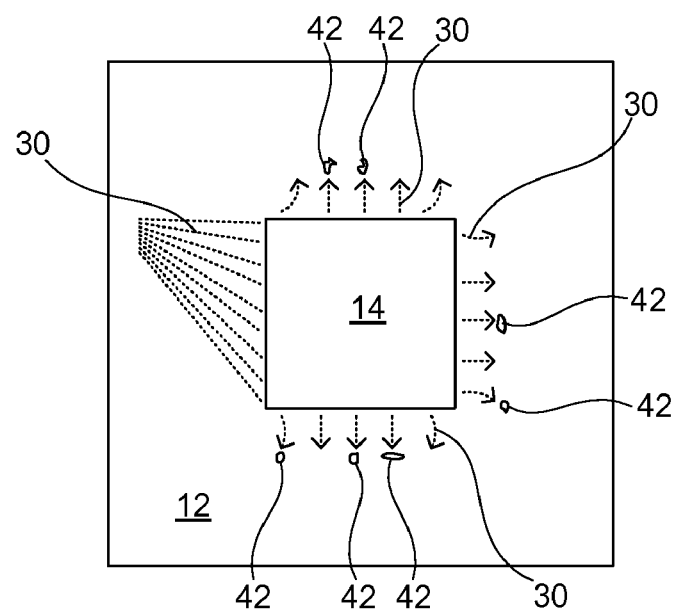
FIG. 4 illustrates a top view of the package assembly of FIG. 3, showing the removal of flux reside from between the chip and substrate by the flow of fluid therebetween, in accordance with certain embodiments.

FIG. 4 illustrates a top view of the package assembly 19 of FIG. 3, showing the fluid 30 contacting the package assembly 19 at a side region of the chip 14 on the substrate 12. The fluid 30 flows into the region between the substrate 12 and chip 14 and flows between the solder bumps 18 and outward from under the chip 14, as indicated by the arrows in FIG. 4. The fluid 30 dislodges the particles 42 from the various surfaces between the substrate 12 and the chip 14 and transmits the particles 42 outward from under the chip 14, together with the fluid 30, in the direction of the arrows. As the substrate 12 and chip 14 continue to move through the cleaning zone and are contacted by additional fluid 30 flow from the nozzles, the flow of the fluid 30 will also remove the dislodged particles 42 from the surface of the substrate 12.

Figure 5:
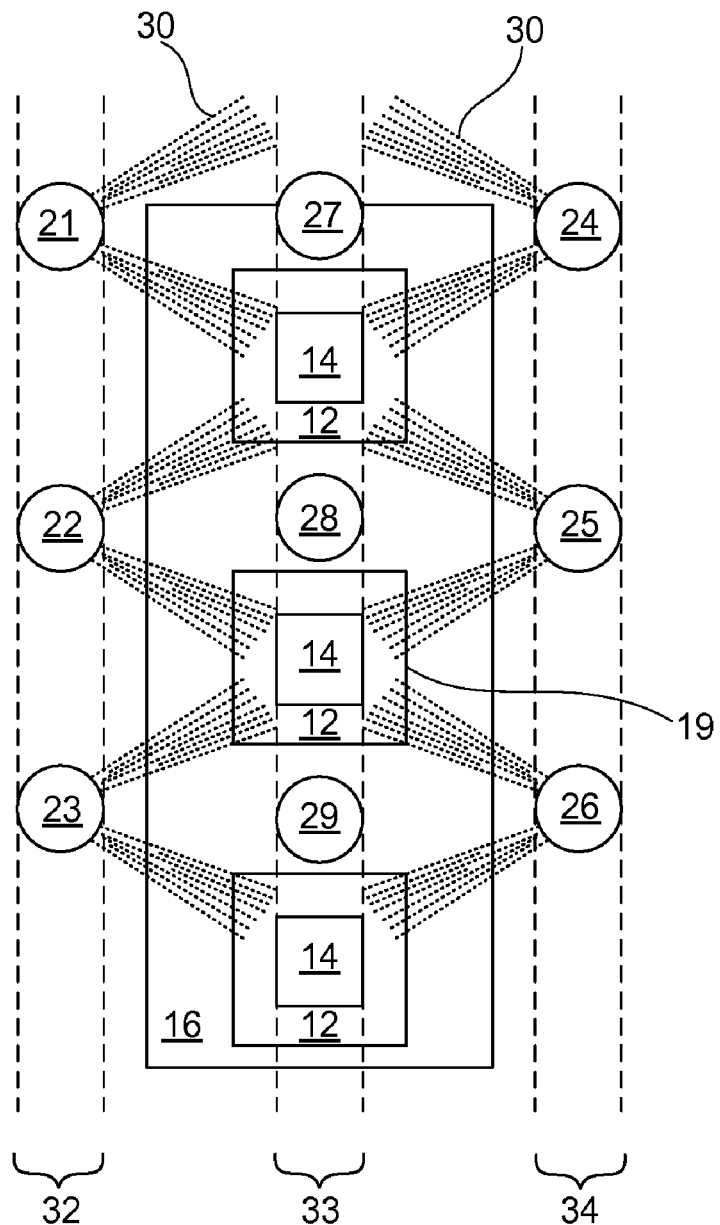
FIG. 5 illustrates a top view of the system for defluxing chip and substrate package assemblies of FIG. 1, with the system adapted to process a different number of package assemblies, in accordance with certain embodiments.

Embodiments may be controlled so that different sizes and numbers of workpieces can be processed using the same system. For example, the system embodiment illustrated in FIG. 1 utilizes nine nozzles 21-29 to deflux six workpieces (package assemblies 19) positioned in a two lane configuration on the carrier 16. The same nozzle system may be utilized to process a different number of workpieces. For example, FIG. 5 illustrates a carrier 16 having three package assemblies 19 each including a die 14 on a substrate 12, positioned in a one lane configuration. When only three package assemblies 19 are positioned on the carrier 16, the size of the area to be treated is smaller than when six package assemblies 19 are positioned on the carrier 16. As a result, it may not be necessary to utilize all nine nozzles 21-29 to achieve a desirable level of defluxing. Thus, the central row 33 of nozzles 27, 28, 29 may be turned off and have no flow of fluid 30 therefrom. In addition, the nozzles 21, 22, 23 and the nozzles 24, 25, 26 are moved closer toward the central row 33 of nozzles 27, 28, 29. Such control enables the user to be able to treat workpieces of various sizes, numbers, and configurations, as well as workpieces on different size carriers, with the same system.

The ability to control the spacing between the nozzles, as well as the spray angle and direction, also enables the user to minimize shadowing effects, which are locations in the gap between the chip and substrate that are not in the line-of-sight of the fluid flow. The detailed process control that embodiments described herein permit will also provide improved deflux processing for the tighter bump pitch, smaller die-substrate gap technologies being developed.

In addition, individual control of the position and spray characteristics of each nozzle enables user to control the length of the wash section in the deflux system based on cleaning efficiency. For instance, in certain configurations, such as the single row configuration of workpieces illustrated in FIG. 5, efficient cleaning can be carried out using six of the nine nozzles 21-29. By moving the nozzles 21, 22, 23 and the nozzles 24, 25, 26 closer together, the wash section is smaller (or narrower) than if the nozzles 21-29 were configured and utilized as in FIG. 1, with all nine nozzles spraying fluid. A smaller wash section leads to a faster, more efficient processing operation.

Figure 6:
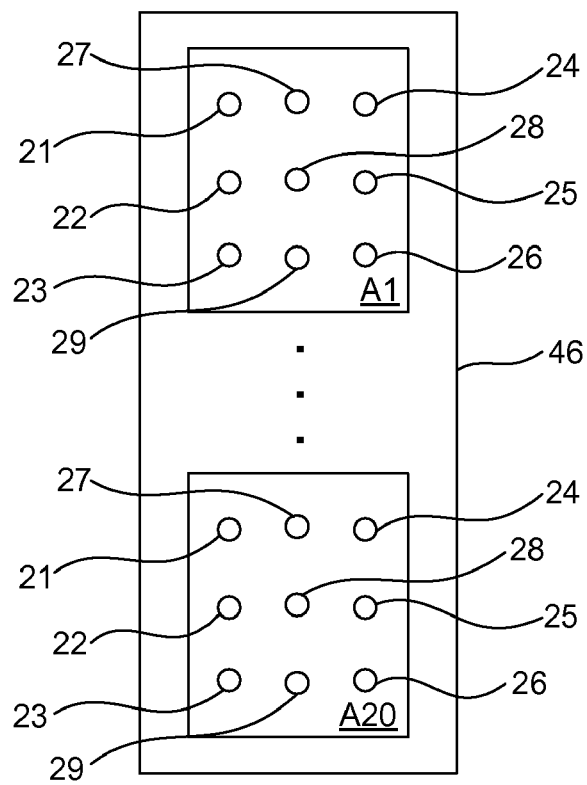
FIG. 6 illustrates a system including multiple arrays of nozzles, in accordance with certain embodiments.

Embodiments may include multiple numbers of arrays of nozzles. For instance, the embodiment of FIG. 6 illustrates a deflux system 46 including multiple arrays A1 through A20 (the dots between A1 and A20 indicate additional arrays), each having nine nozzles 21-29. In the embodiment of FIG. 6, the arrays A1 through A20 are aligned in a sequential manner along the length of the deflux system 46. The number of arrays present in the system may be varied to control the overall length of the deflux system. Deflux equipment may in certain instances be up to about 20 feet long, with up to about 20 sets or arrays of nozzles, depending on the process optimization and package reliability requirements for the deflux equipment.

Figure 7:
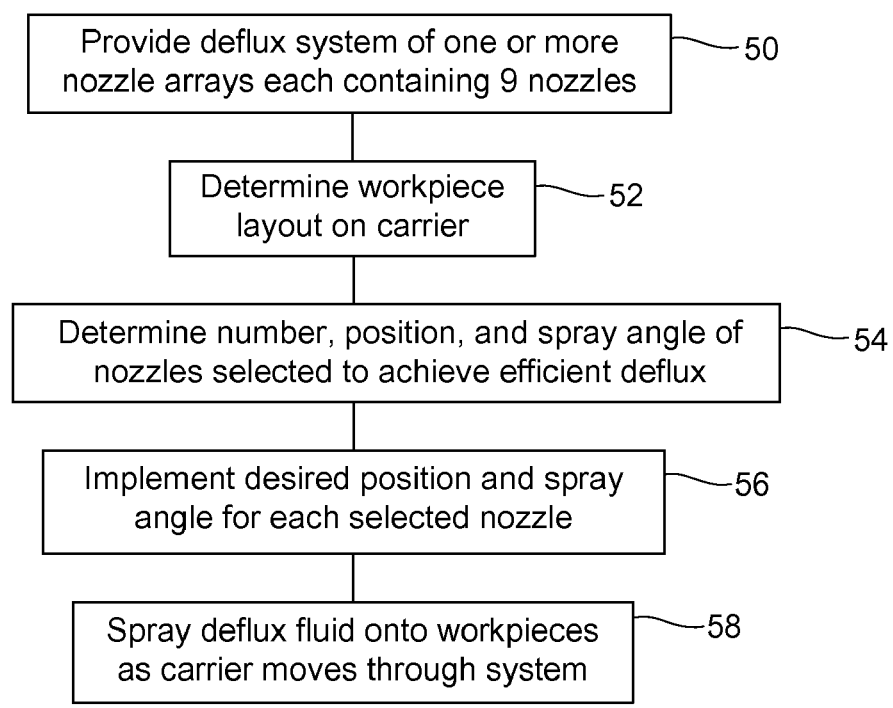
FIG. 7 illustrates a flow chart of operations for a deflux process, in accordance with certain embodiments.

FIG. 7 illustrates an example of a deflux process flowchart using a system in accordance with embodiments such as described above. Box 50 is providing a system for performing defluxing operation, including one or more arrays of nine nozzles. Box 52 is determining the layout of the workpieces (e.g., package assemblies) positioned on a carrier (or carriers) in the system. For example, the carrier may include one, two, or more than two rows of package assemblies that include a chip positioned on a substrate. In certain embodiments, the carrier size may dictate the size and layout of the package assemblies thereon. In such a situation, only the carrier size may need to be determined to properly configure the system. Box 54 is determining how many nozzles (and arrays of nozzles) are needed to efficiently deflux the workpieces on the carrier, as well as the desired position and spray angle for each of the nozzles. Certain embodiments include up to twenty arrays, each array including nine nozzles. Box 56 is implementing the desired position and spray angle for each of the selected nozzles. Box 58 is spraying the deflux fluid, which may include one or more components therein, onto the workpieces as the carrier moves through the system. It should be appreciated that various additions, deletions, and changes may be made to the flowchart of operations. For example, certain embodiments may have more or less than nine nozzles.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
providing a deflux system including at least one array of nozzles adapted to spray a fluid, the array including a plurality of rows of nozzles with a plurality of nozzles in each row;
providing at least one workpiece positioned on a carrier;
sensing information relating to at least one of the carrier and the at least one workpiece positioned thereon so that a workpiece layout can be determined for the at least one workpiece on the carrier;
sending a signal to a controller to place each of a selected number of the nozzles at a selected position and a selected angle based on the workpiece layout on the carrier; and
spraying the at least one workpiece with the fluid from the selected nozzles to deflux the workpiece.

2. The method of claim 1, wherein the at least one array of nozzles includes an array of nine nozzles, including three rows with three nozzles in each row.

3. The method of claim 1, further comprising positioning all the nozzles so that an area defined by the nozzles is smaller than that defined by the carrier.

4. The method of claim 1, further comprising delivering a fluid including a plurality of components to the selected nozzles.

5. The method of claim 1, wherein the spraying the at least one workpiece comprises spraying a fluid selected from a group consisting of water, air, non-aqueous solvents, and combinations thereof.

6. The method of claim 1, wherein the spraying the at least one workpiece comprises delivering pulses of differing fluids through at least some of the selected nozzles.

7. The method of claim 1, wherein at least one of the selected nozzles includes multiple fluid inputs therein, and wherein the spraying the at least one workpiece comprises providing a different fluid to each fluid input and spraying the different fluids onto the workpiece.

8. The method of claim 2, wherein the nine nozzles are all positioned directly over the carrier during the spraying.

9. A method comprising:
providing a deflux system including at least one array of nozzles adapted to spray a fluid, the array including a plurality of rows with a plurality of nozzles in each row;
providing at least one workpiece positioned on a carrier on a movable track;
sensing information relating to at least one of the carrier and the at least one workpiece positioned thereon so that a workpiece layout can be determined for the at least one workpiece on the carrier;
sending a signal to a controller to place each of a selected number of the nozzles at a selected position and a selected angle based on the workpiece layout on the carrier; and
spraying the at least one workpiece with the fluid from the selected nozzles to deflux the workpiece,
wherein an area defined by the array of nozzles is less than an area defined by the carrier.

10. The method of claim 9, wherein the at least one array of nozzles includes an array of nine nozzles arranged in three rows with three nozzles in each row.

11. The method of claim 9, further comprising delivering a fluid including a plurality of components to the selected nozzles.

12. The method of claim 9, wherein the spraying the at least one workpiece comprises spraying a fluid selected from a group consisting of water, air, non-aqueous solvents, and combinations thereof.

13. The method of claim 9, wherein the spraying the at least one workpiece comprises delivering pulses of differing fluids through at least some of the selected nozzles.

14. The method of claim 9, wherein the nozzles in the array are all positioned directly over the carrier during the spraying.

15. The method of claim 9, wherein at least one of the selected nozzles includes multiple fluid inputs therein, and wherein the spraying the at least one workpiece comprises providing a different fluid to each fluid input and spraying the different fluids onto the workpiece.

* * * * *